US008628004B2

(12) United States Patent
Vazach et al.

(10) Patent No.: US 8,628,004 B2
(45) Date of Patent: Jan. 14, 2014

(54) AUTOMATION CONTROL SYSTEM COMPONENTS WITH ELECTRONIC KEYING FEATURES

(75) Inventors: Joseph G. Vazach, Mentor, OH (US); David S. Wehrle, Chesterland, OH (US); Douglas R. Bodmann, Shaker Heights, OH (US); Robert J. Kretschmann, Bay Village, OH (US); Gregg M. Sichner, Mentor, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 166 days.

(21) Appl. No.: 13/213,921

(22) Filed: Aug. 19, 2011

(65) Prior Publication Data
US 2012/0043378 A1 Feb. 23, 2012

Related U.S. Application Data

(60) Provisional application No. 61/375,587, filed on Aug. 20, 2010.

(51) Int. Cl.
*G06F 17/00* (2006.01)
(52) U.S. Cl.
USPC ................................. 235/375; 235/462.46
(58) Field of Classification Search
USPC ................ 235/375, 492, 462.46, 472.02
See application file for complete search history.

(56) References Cited

U.S. PATENT DOCUMENTS

| 2010/0090006 A1* | 4/2010 | Gomez et al. ............... 235/454 |
| 2010/0116880 A1* | 5/2010 | Stollman ...................... 235/380 |
| 2010/0179685 A1* | 7/2010 | Meyer et al. ................. 700/227 |
| 2011/0058201 A1* | 3/2011 | Mueller ........................ 358/1.13 |

OTHER PUBLICATIONS

U.S. Appl. No. 13/213,996, filed Aug. 19, 2011, Molnar.
U.S. Appl. No. 13/214,072, filed Aug. 19, 2011, Molnar.
U.S. Appl. No. 13/213,991, filed Aug. 19, 2011, Molnar.
U.S. Appl. No. 13/213,950, filed Aug. 19, 2011, Wehrle.
U.S. Appl. No. 13/214,027, filed Aug. 19, 2011, Bodmann.
U.S. Appl. No. 13/214,035, filed Aug. 19, 2011, Kretschmann.

* cited by examiner

*Primary Examiner* — Daniel StCyr
(74) *Attorney, Agent, or Firm* — Fletcher Yoder, P.C.; R. Scott Speroff; John M. Miller

(57) ABSTRACT

Systems and methods for utilizing electronic keying features stored within one of the components (e.g., I/O modules, terminal blocks, bases) of I/O devices may include reading or detecting the electronic keying features using electronic key identification circuitry in one of the other components of the I/O devices. More specifically, the electronic keying features may include unique identification keys that may be read or detected by the electronic key identification circuitry to determine whether the components (e.g., a paired I/O module and terminal block) are associated with each other and intended to operate together. For example, the electronic key feature may be disposed within a terminal block and the electronic key identification circuitry may be disposed within an I/O module, or vice versa. In addition, the electronic key feature and/or the electronic key identification circuitry may be removable from their respective component of the I/O device.

24 Claims, 7 Drawing Sheets

US 8,628,004 B2

AUTOMATION CONTROL SYSTEM COMPONENTS WITH ELECTRONIC KEYING FEATURES

CROSS REFERENCE TO RELATED APPLICATIONS

This application claims priority of U.S. Provisional Patent Application No. 61/375,587, filed Aug. 20, 2010, which is herein incorporated in its entirety by reference.

BACKGROUND

The invention relates generally to the field of automation control systems, such as those used in industrial and commercial settings. More particularly, embodiments of the present invention relate to techniques for providing, accessing, configuring, operating, or interfacing with input/output (I/O) devices that are configured for coupling and interaction with an automation controller.

Automation controllers are special purpose computers used for controlling industrial automation and the like. Under the direction of stored programs, a processor of the automation controller examines a series of inputs (e.g., electrical input signals to the automation controller) reflecting the status of a controlled process and changes outputs (e.g., electrical output signals from the automation controller) based on analysis and logic for affecting control of the controlled process. The stored control programs may be continuously executed in a series of execution cycles, executed periodically, or executed based on events. The inputs received by the automation controller from the controlled process and the outputs transmitted by the automation controller to the controlled process are normally passed through one or more I/O devices, which are components of an automation control system that serve as an electrical interface between the automation controller and the controlled process.

Traditional I/O devices typically include a base configured to couple the I/O device with a bus bar or the like, a terminal block for communicatively coupling the I/O device with field devices, and an I/O module that includes circuitry for performing communication functions and/or logic operations. During maintenance of the I/O devices, the I/O modules and/or the terminal blocks of the I/O devices may be removed from their respective bases to facilitate performing diagnostics and troubleshooting of the I/O devices. Sometimes, when the I/O modules and/or the terminal blocks are re-inserted into their respective bases (e.g., once maintenance has been completed), one or more of the I/O modules and/or terminal blocks may be inadvertently re-inserted into a base for which it was not intended. As such, inadvertent mismatches of I/O modules and terminal blocks may occur. As a result, unexpected control issues may arise due to such mismatches. It is now recognized that it is desirable to provide reliable features for preventing such inadvertent insertion of I/O modules and/or terminal blocks into bases to which they are not intended.

BRIEF DESCRIPTION

The present invention addresses shortcomings of traditional I/O devices by providing electronic keying features that may be stored within one of the components (e.g., the I/O modules, the terminal blocks, the bases, and so forth) of the I/O devices, and which may be read or detected by electronic key identification circuitry in one of the other components of the I/O devices. More specifically, the electronic keying features may include unique identification keys that may be read or detected by the electronic key identification circuitry to determine whether the components (e.g., a paired I/O module and terminal block) are associated with each other and intended to operate together. For example, in certain embodiments, the electronic key feature may be disposed within a terminal block and the electronic key identification circuitry may be disposed within an I/O module, or vice versa. In addition, in certain embodiments, the electronic key feature and/or the electronic key identification circuitry may be removable from their respective component of the I/O device.

DRAWINGS

These and other features, aspects, and advantages of the present invention will become better understood when the following detailed description is read with reference to the accompanying drawings in which like characters represent like parts throughout the drawings, wherein.

Figure 9:
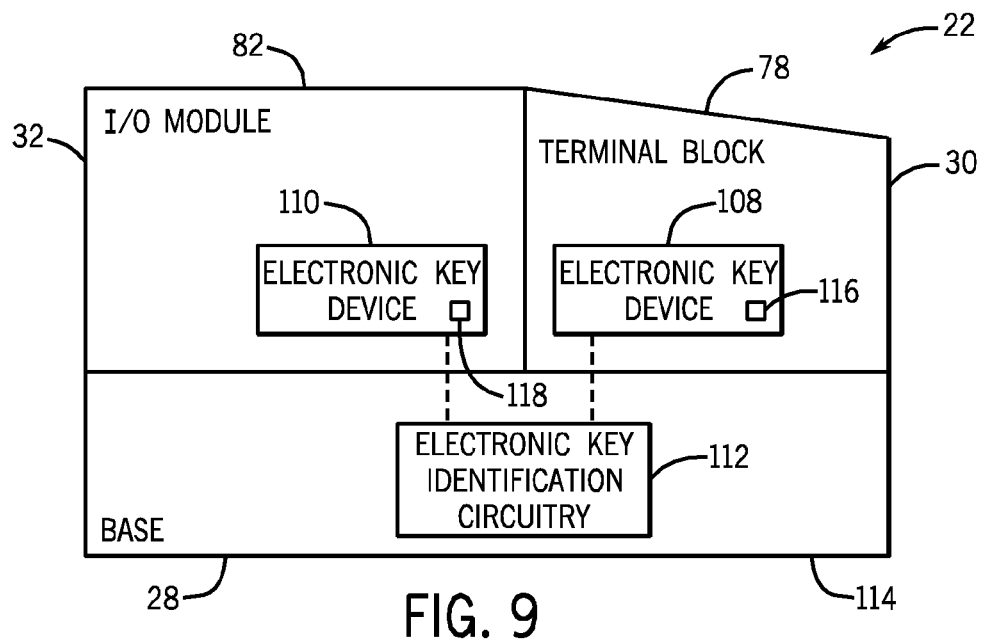
Figure 10:
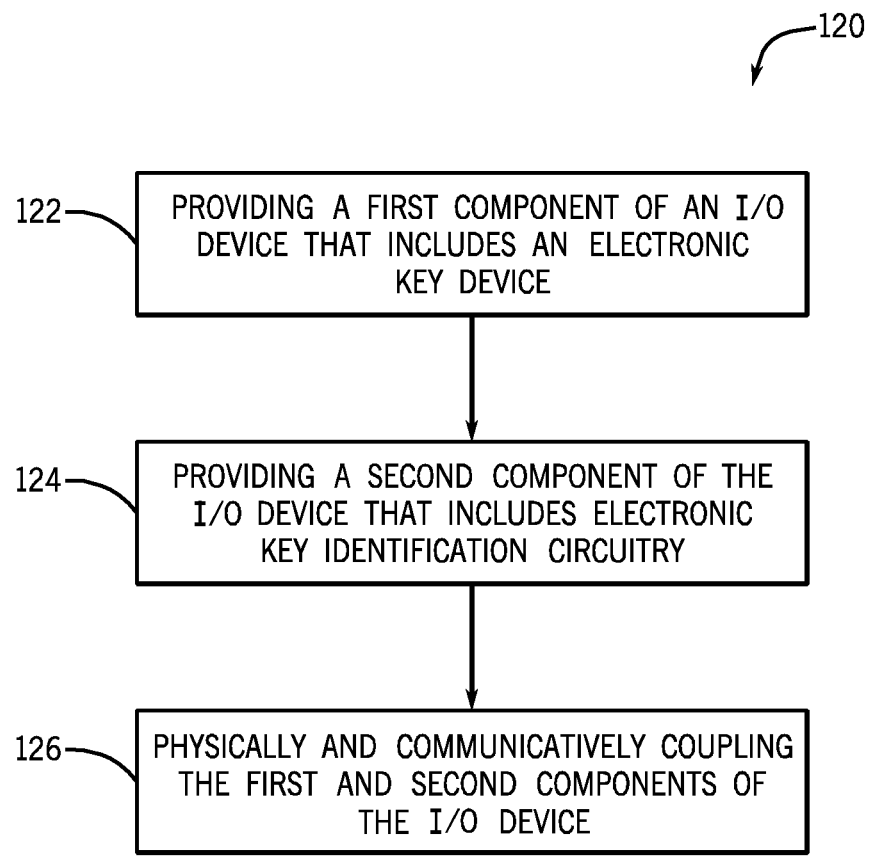

FIG. 9 is a schematic diagram of an exemplary I/O device that utilizes electronic key devices in both the terminal block and the I/O module of the I/O device in accordance with embodiments of the present techniques; and FIG. 10 is a process flow diagram of a method of manufacturing an I/O device having components that are linked via an electronic key device in accordance with the present techniques.

DETAILED DESCRIPTION

Figure 1:
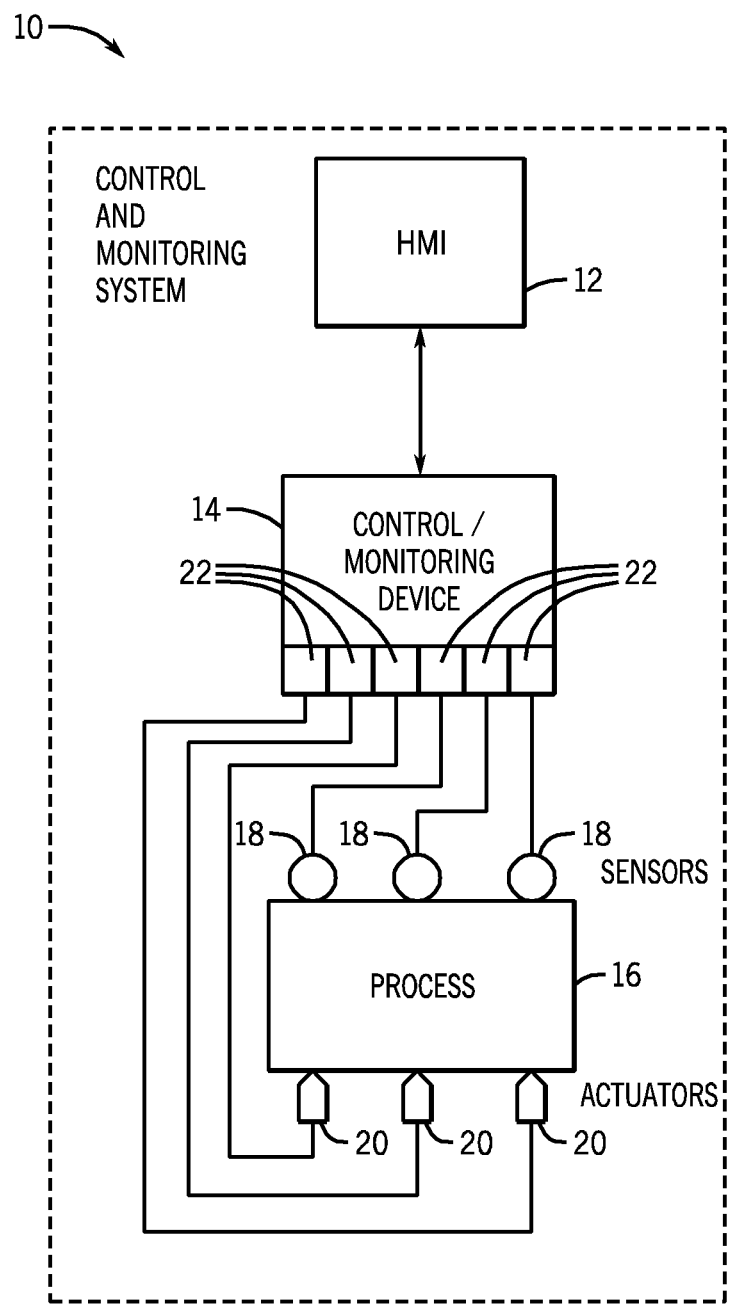
FIG. 1 is a diagrammatical representation of an exemplary control and monitoring system adapted to interface with networked components and configuration equipment in accordance with embodiments of the present techniques.

FIG. 1 is a diagrammatical representation of an exemplary control and monitoring system adapted to interface with networked components and configuration equipment in accordance with embodiments of the present techniques. The control and monitoring system is generally indicated by reference numeral 10. Specifically, the control and monitoring system 10 is illustrated as including a human machine interface (HMI) 12 and an automation controller or control/monitoring device 14 adapted to interface with components of a process 16. It should be noted that such an interface in accordance with embodiments of the present techniques may be facilitated by the use of certain network strategies. Indeed, an industry standard network may be employed, such as DeviceNet, to enable data transfer. Such networks permit the exchange of data in accordance with a predefined protocol, and may provide power for operation of networked elements.

The process 16 may take many forms and include devices for accomplishing many different and varied purposes. For example, the process 16 may comprise a compressor station, an oil refinery, a batch operation for making food items, a mechanized assembly line, and so forth. Accordingly, the process 16 may comprise a variety of operational components, such as electric motors, valves, actuators, temperature elements, pressure sensors, or a myriad of manufacturing, processing, material handling, and other applications. Further, the process 16 may comprise control and monitoring equipment for regulating process variables through automation and/or observation.

For example, the illustrated process 16 comprises sensors 18 and actuators 20. The sensors 18 may comprise any number of devices adapted to provide information regarding process conditions. The actuators 20 may include any number of devices adapted to perform a mechanical action in response to a signal from a controller (e.g., an automation controller). The sensors 18 and actuators 20 may be utilized to operate process equipment. Indeed, they may be utilized within process loops that are monitored and controlled by the control/monitoring device 14 and/or the HMI 12. Such a process loop may be activated based on process inputs (e.g., input from a sensor 18) or direct operator input received through the HMI 12.

As illustrated, the sensors 18 and actuators 20 are in communication with the control/monitoring device 14 and may be assigned a particular address in the control/monitoring device 14 that is accessible by the HMI 12. As illustrated, the sensors 18 and actuators 20 may communicate with the control/monitoring device 14 via one or more I/O devices 22 coupled to the control/monitoring device 14. The I/O devices 22 may transfer input and output signals between the control/monitoring device 14 and the controlled process 16. The I/O devices 22 may be integrated with the control/monitoring device 14, or may be added or removed via expansion slots, bays or other suitable mechanisms. For example, as described in greater detail below, additional I/O devices 22 may be added to add functionality to the control/monitoring device 14. Indeed, if new sensors 18 or actuators 20 are added to control the process 16, additional I/O devices 22 may be added to accommodate and incorporate the new features functionally with the control/monitoring device 14. The addition of I/O devices 22 may include disassembly of components of the I/O devices 22, and present embodiments include electronic keying features to associate related components during reassembly. It should be noted that the I/O devices 22 serve as an electrical interface to the control/monitoring device 14 and may be located proximate or remote from the control/monitoring device 14, including remote network interfaces to associated systems.

The I/O devices 22 may include input modules that receive signals from input devices such as photo-sensors and proximity switches, output modules that use output signals to energize relays or to start motors, and bidirectional I/O modules, such as motion control modules which can direct motion devices and receive position or speed feedback. In some embodiments, the I/O devices 22 may convert between AC and DC analog signals used by devices on a controlled machine or process and DC logic signals used by the control/monitoring device 14. Additionally, some of the I/O devices 22 may provide digital signals to digital I/O devices and receive digital signals from digital I/O devices. Further, in some embodiments, the I/O devices 22 that are used to control machine devices or process control devices may include local microcomputing capability on an I/O module of the I/O devices 22.

In some embodiments, the I/O devices 22 may be located in close proximity to a portion of the control equipment, and away from the remainder of the control/monitoring device 14. In such embodiments, data may be communicated with remote modules over a common communication link, or network, wherein modules on the network communicate via a standard communications protocol. Many industrial controllers can communicate via network technologies such as Ethernet (e.g., IEEE802.3, TCP/IP, UDP, EtherNet/IP, and so forth), ControlNet, DeviceNet or other network protocols (Foundation Fieldbus (H1 and Fast Ethernet) Modbus TCP, Profibus) and also communicate to higher level computing systems.

Figure 2:
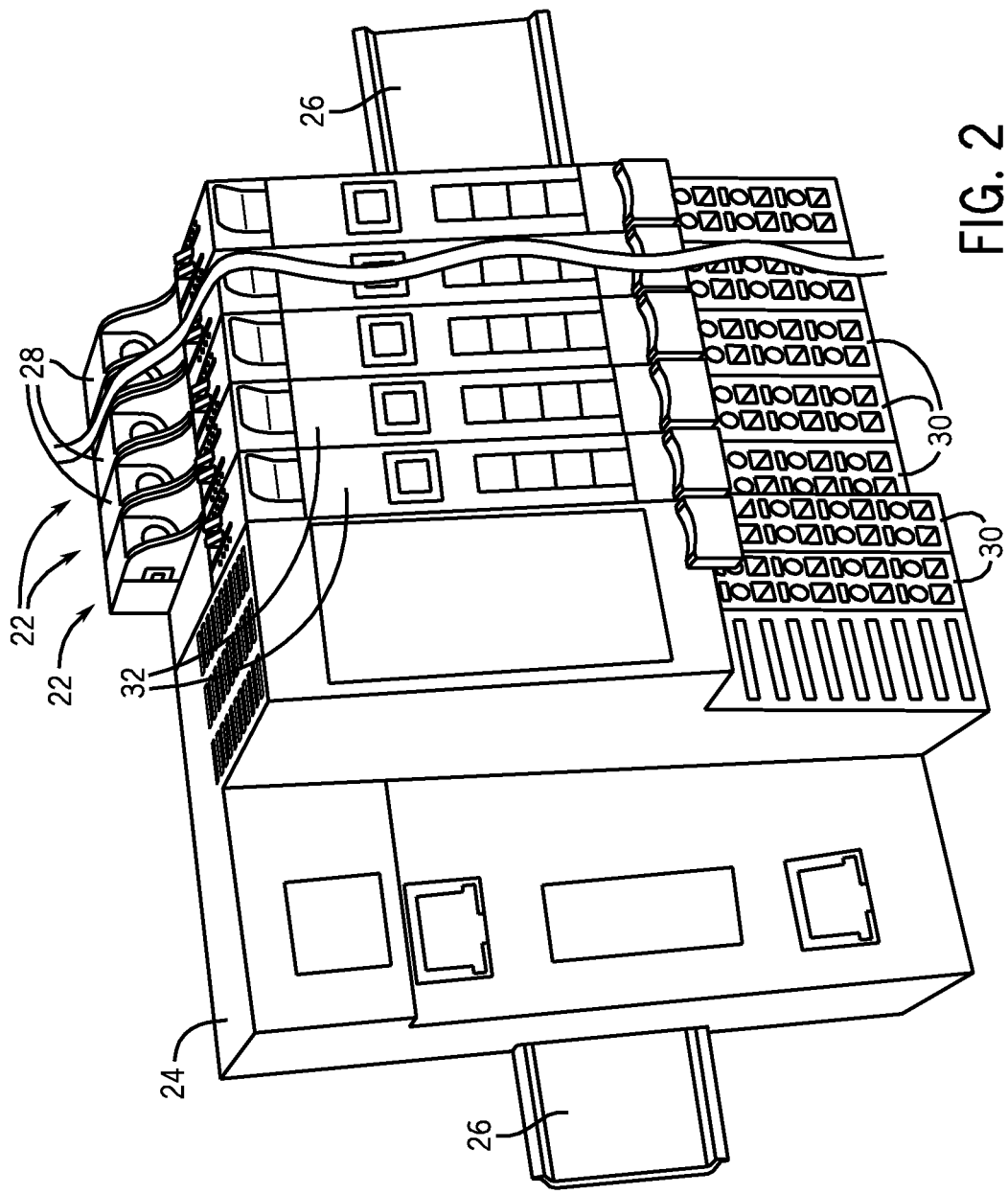
FIG. 2 is a perspective view of a plurality of I/O devices connected to an I/O adapter in accordance with embodiments of the present techniques.

FIG. 2 is a perspective view of a plurality of I/O devices 22 connected to an I/O adapter 24 in accordance with embodiments of the present techniques. The I/O adapter 24 is configured to provide system power to the I/O modules 22, as well as to enable conversion between the communications protocols of the I/O devices 22 and the control/monitoring device 14. As illustrated, the I/O adapter 24 and the plurality of I/O devices 22 are mounted to a DIN rail 26, which is an industry standard support rail for mounting control equipment in racks and cabinets. As described in greater detail below, the plurality of I/O devices 22 are electrically coupled in series along the DIN rail 26 such that field power and system information and power may be communicated between the I/O devices 22, and back through the I/O adapter 24 to the control/monitoring device 14. In other embodiments, the DIN rail 26 may be replaced with a different type of mounting structure.

As also described in greater detail below, each of the I/O devices 22 includes a base 28 for physically and communicatively connecting the I/O device 22 to the DIN rail 26, the I/O adapter 24 and/or adjacent I/O devices 22. In addition, each of the I/O devices 22 includes a terminal block 30 (which, in certain embodiments, may be removable from the base 28) for electrically connecting the I/O device 22 to field devices, such as the sensors 18 and actuators 20 illustrated in FIG. 1. Furthermore, each of the I/O devices 22 includes one or more I/O modules 32, which include I/O control circuitry and/or logic. In general, the I/O modules 32 receive input signals from the field devices, deliver output signals to the field devices, perform general and/or specific local functionality on the inputs and/or outputs, communicate the inputs and/or outputs to the control/monitoring device 14 and/or the other I/O devices 22, and so forth. As described in greater detail below, in certain embodiments, the I/O devices 22 may include electronic keying features and associated electronic key identification circuitry, which may be disposed in the terminal blocks 30, the I/O modules 32, and/or the bases 28 of the I/O devices 22, and may be used to prevent inadvertent mismatching of associated terminal blocks 30, I/O modules 32, and bases 28.

Figure 3:
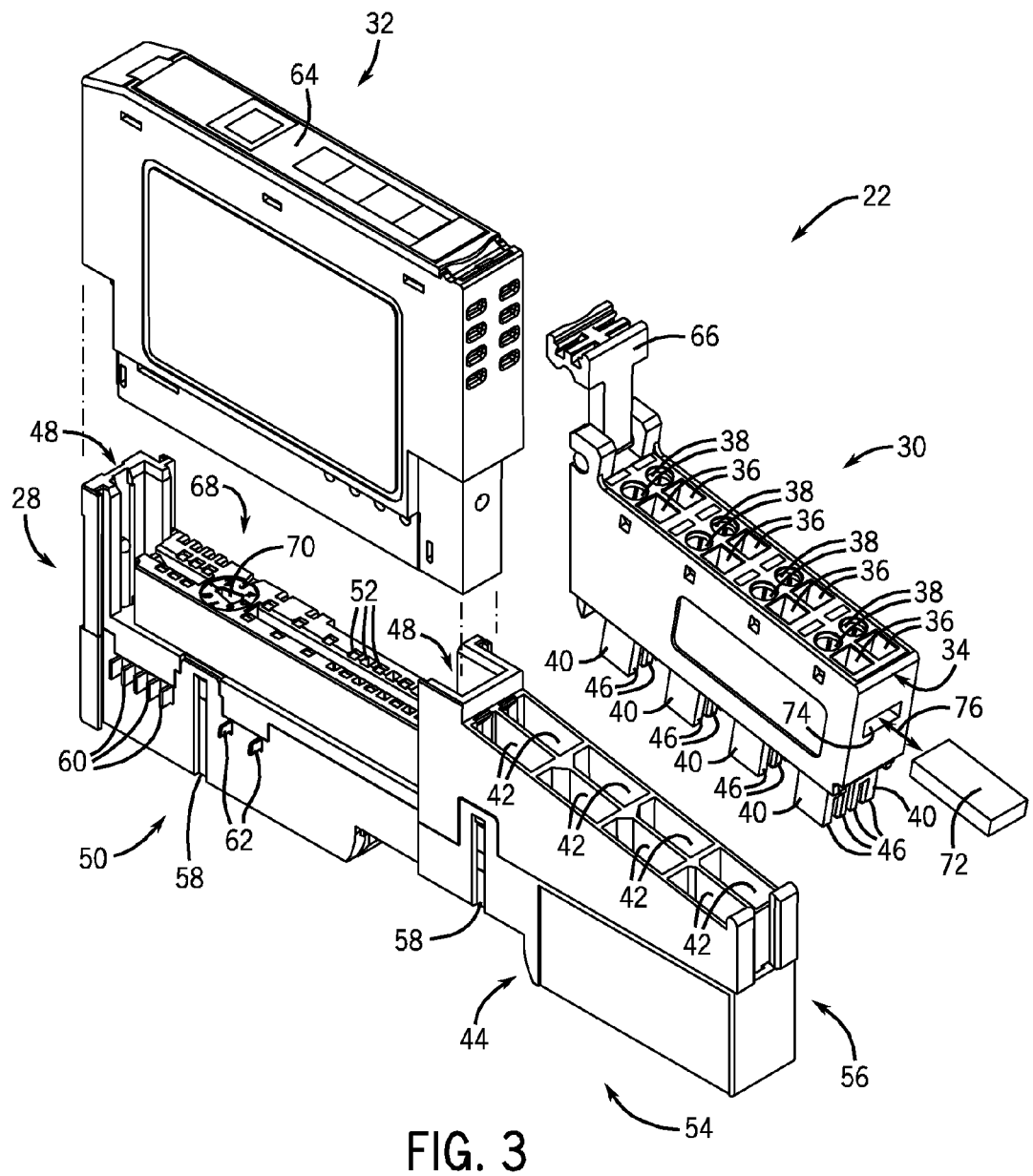
FIG. 3 is an exploded perspective view of an exemplary I/O device in accordance with embodiments of the present techniques.

FIG. 3 is an exploded perspective view of an exemplary I/O device 22 in accordance with embodiments of the present techniques. In the embodiment illustrated in FIG. 3, the terminal block 30 is a removable terminal block that may be physically connected and electrically coupled to the base 28 during assembly of the I/O device 22, and physically disconnected and electrically decoupled during disassembly (e.g., for servicing) of the I/O device 22. The removable nature of the illustrated terminal block 30 enables replacement of the I/O module 32 without the need for re-wiring. However, as described above, in other embodiments, the terminal block 30 may be directly integrated with the base 28. Such integrated embodiments may be desirable, for example, in process automation control applications for which the specific arrangement of electrical connections may be somewhat complex, and the ability to maintain these electrical connections during servicing is of greater importance.

As illustrated, the terminal block 30 includes eight terminals 34 (i.e., channels) for connecting field device wiring to the terminal block 30. Each of the terminals 34 is capable of being associated with a particular input to and/or output from a field device. As illustrated, each terminal 34 includes a terminal opening 36 into which a field wire electrically connected to a field device may be inserted, and an attachment activator (e.g., a terminal screw) 38, which when activated (e.g., tightened) causes a clamp or other electrical wiring connection mechanism within the terminal block 30 to tighten around an end of a field wire that has been inserted into the associated terminal opening 36. As illustrated, each of the terminals 34 terminates at the back of the terminal block 30 with a terminal block connector 40, which may be inserted into terminal block connector openings 42 in the front of a terminal block bay 44 of the base 28 to physically and communicatively connect the terminal block 30 with the base 28. In the illustrated embodiment, each of the terminal block connectors 40 includes two opposing electrical prongs 46 that slide around and electrically connect with a single electrical prong (not shown) in the respective terminal block connector opening 42 of the terminal block bay 44 of the base 28. However, in other embodiments, other types of terminal block connectors 40 may be used to electrically connect with mating electrical connectors in the respective terminal block connector opening 42 of the terminal block bay 44 of the base 28.

The I/O module 32 may also be physically and communicatively connected to the base 28 by inserting the I/O module 32 into a mating slot 48 in an I/O module bay 50 of the base 28. When the I/O module 32 is inserted into the slot 48 in the I/O module bay 50 of the base 28, the I/O module 32 becomes electrically coupled to the terminals 34 of the terminal block 30 via internal circuitry within the base 28 that electrically connects the electrical prongs (or other suitable electrical connectors) in the terminal block connector openings 42 to respective electrical outlets 52 in the front of the I/O module bay 50 of the base 28. The electrical outlets 52 for each channel are in turn electrically coupled to the I/O module 32 via respective electrical connectors (not shown) that, in certain embodiments, extend from the back of the I/O module 32. As such, the terminal block 30, the base 28, and the I/O module 32 are all electrically and communicatively coupled together such that signals to and from the field device to which the I/O device 22 is connected are shared between the terminal block 30, the base 28, and the I/O module 32.

In addition, the I/O device 22 may also be electrically coupled to an I/O adapter 24 electrically upstream, and/or other I/O devices 22 electrically upstream or electrically downstream via electrical coupling features of the I/O device 22. In certain embodiments, components that are coupled electrically upstream of the I/O device 22 are components that are on a left side 54 of the I/O device 22 when viewing the I/O device 22 from the front, and components that are electrically coupled downstream of the I/O device 22 are components that are on a right side 56 of the I/O device 22 when viewing the I/O device 22 from the front. However, in other embodiments, the upstream and downstream electrical coupling features may be configured differently.

In certain embodiments, adjacent I/O devices 22 may be physically attached to each other via one or more connection features (e.g., slots) 58 of the base 28 on one of the sides (e.g., the left side 54 of the illustrated embodiment) of the I/O device 22 near the back of the base 28. Mating connection features such as protrusions (not shown) on the opposite side (e.g., the right side 56 of the illustrated embodiment) of the base 28 of the I/O device 22 near the back of the base 28. In certain embodiments, connection features of an I/O device 22 may slide into mating connection features of an adjacent I/O device 22, thereby physically attaching the adjacent I/O devices 22.

When adjacent I/O devices 22 are physically attached to each other, system electrical contacts 60 on the base 28 on one of the sides (e.g., the left side 54 of the illustrated embodiment) align with and are electrically coupled to mating electrical contacts (not shown) on the base 28 on the opposite side (e.g., the right side 56 of the illustrated embodiment) of an adjacent I/O device 22. Similarly, field electrical contacts 62 on the base 28 on one of the sides (e.g., the left side 54 of the illustrated embodiment) align with and are electrically coupled to mating electrical contacts (not shown) on the base 28 on the opposite side (e.g., the right side 56 of the illustrated embodiment) of an adjacent I/O device 22. In the illustrated embodiment, the I/O device 22 includes five system electrical contacts 60 and two field electrical contacts 62. In such an embodiment, system power may be electrically communicated via electrically connected I/O devices 22 and/or the I/O adapter 24 via two of the system electrical contacts 60, while the three other system electrical contacts 60 are used for transmission of data (e.g., relating to signals transmitted to and from the field devices to which the I/O devices 22 are electrically connected) between the electrically connected I/O devices 22 and the I/O adapter 24. In addition, the two field electrical contacts 62 are used to electrically communicate power to the field devices to which the I/O devices 22 are electrically connected. However, it will be understood that the specific number of system electrical contacts 60 and field electrical contacts 62 may vary between implementations depending on the requirements for power and data transmission of the I/O devices 22.

As illustrated, in certain embodiments, the I/O module 32 may include a status display 64 on the front face of the I/O module 32 for displaying operating status information of the I/O module 32, the base 28, and the terminal block 30. The status display 64 may, for example, include status light emitting diodes (LEDs) corresponding to each of the terminals 34 of the terminal block 30. In addition, in certain embodiments, once the terminal block 30 and the I/O module 32 are physically and communicatively connected to the base 28 of the I/O device 22, a latch 66 or other fastening device extending from the terminal block 30 may further attach the terminal block 30 to the I/O module 32, thereby providing additional structural support and stabilizing the electrical connections between the terminal block 30, the I/O module 32, and the base 28.

As described above and illustrated in FIG. 3, in certain embodiments, the base 28, terminal block 30, and I/O module 32 of the I/O device 22 may be separate components that may be physically, electrically, and communicatively coupled and decoupled from each other as needed. For example, in certain embodiments where the terminal block 30 is a removable terminal block 30 as illustrated in FIG. 3, the terminal block 30 may be removed from the base 28 of the I/O device 22 to investigate connections between the base 28 and the terminal block 30 without disturbing the connection of field wires from the field device to which the I/O device 22 is connected. As another example, different I/O modules 32 may be inserted into the base 28 of the I/O device 22 to provide different levels of I/O functionality. For example, certain I/O modules 32 may provide general functionality, such as receiving signals from the field device to which the I/O device 22 is connected, transmitting the received signals to an automation controller (e.g., the control/monitoring device 14 of FIG. 1), receiving control signals from the automation controller, and transmitting the control signals to the field device. However, other I/O modules 32 may provide more specific functionality, such as performing specific operations on the signals that are received from the field device, the automation controller, and so forth. For example, certain I/O modules 32 may include specific software for performing specific operations relating to particular types of equipment, particular industry applications, particular local control functions (e.g., performed within the I/O module 32), and so forth. Therefore, although the bases 28 of adjacent I/O devices 22 may remain attached to each other during operation of the I/O devices 22, the terminal blocks 30 and/or I/O modules 32 of the I/O devices 22 may often be removed and re-inserted for diagnostics and troubleshooting of one or more I/O devices 22 and/or for changing the functionality of one or more of the I/O devices 22. Indeed, this is an advantageous aspect of the modular nature of the terminal blocks 30 and the I/O modules 32 illustrated in FIGS. 2 and 3.

However, it is now recognized that occasionally during maintenance, more than one terminal block 30 and/or I/O module 32 are removed from a series of interconnected I/O devices 22, such as the series of I/O devices 22 illustrated in FIG. 2. As such, when the terminal blocks 30 and the I/O modules 32 are re-assembled together, a terminal block 30 and/or I/O module 32 may be inadvertently re-inserted into a base 28 to which the terminal block 30 and/or I/O module 32 is not associated, which can lead to unexpected control issues if not addressed. One solution for ensuring that terminal blocks 30 and I/O modules 32 are not inserted into a base 28 to which they are not associated is the use of mechanical keying features 68 that mechanically prohibit certain terminal blocks 30 and I/O modules 32 from being inserted into certain bases 28. For example, as illustrated in FIG. 3, the base 28 may include a mechanical keying feature 68 in the form of a circular key in the front of the I/O module bay 50 of the base 28, wherein the mechanical keying feature 68 includes a slot 70 into which a mating protrusion of a mating mechanical keying feature (not shown), such as a mating circular key, in the back of the associated I/O module 32 may align and be inserted. The mechanical keying feature 68 of the base 28 illustrated in FIG. 3 may rotate, for example, between ten rotational positions, and the mating mechanical keying feature in the back of the associated I/O module 32 may similarly rotate between ten rotational positions. As such, the base 28 and associated I/O module 32 may be set to the same rotational positions such that the I/O module 32 may be physically inserted into its associated base 28, but not into bases that are set to the other nine rotational positions. In addition, the terminal blocks 30 and associated bases 28 may include similar mechanical keying features. The rotational mechanical keying features 68 illustrated in FIG. 3 are merely exemplary and not intended to be limiting. Other types of mechanical keying features 68 may also be used to ensure that the terminal blocks 30 and I/O modules 32 are only inserted into their associated bases 28.

However, the mechanical keying feature 68 illustrated in FIG. 3 includes only a finite number (e.g., ten) of mechanical keying positions (e.g., the rotational positions discussed above). As such, when using mechanical keying features 68, there may still be a relatively high probability (e.g., one in ten) that a terminal block 30 or I/O module 32 may be inserted into a base 28 to which it is not intended to be associated, because the mating mechanical keying features 68 between the terminal block 30 and/or I/O module 32 and the base 28 into which it is inserted are unintentionally set to the same mechanical keying position. For example, assuming that the mating mechanical keying features 68 include ten different mechanical keying positions as discussed above, there will always be approximately a 10% chance that any given terminal block 30 or I/O module 32 may be set to the same mechanical keying position as the base 28 into which the terminal block 30 or I/O module 32 is inserted. In other words, in this example, the mechanical keying features 68 only prevent inadvertent insertion of the terminal block 30 or I/O module 32 for approximately 90% of available bases 28.

Figure 4:
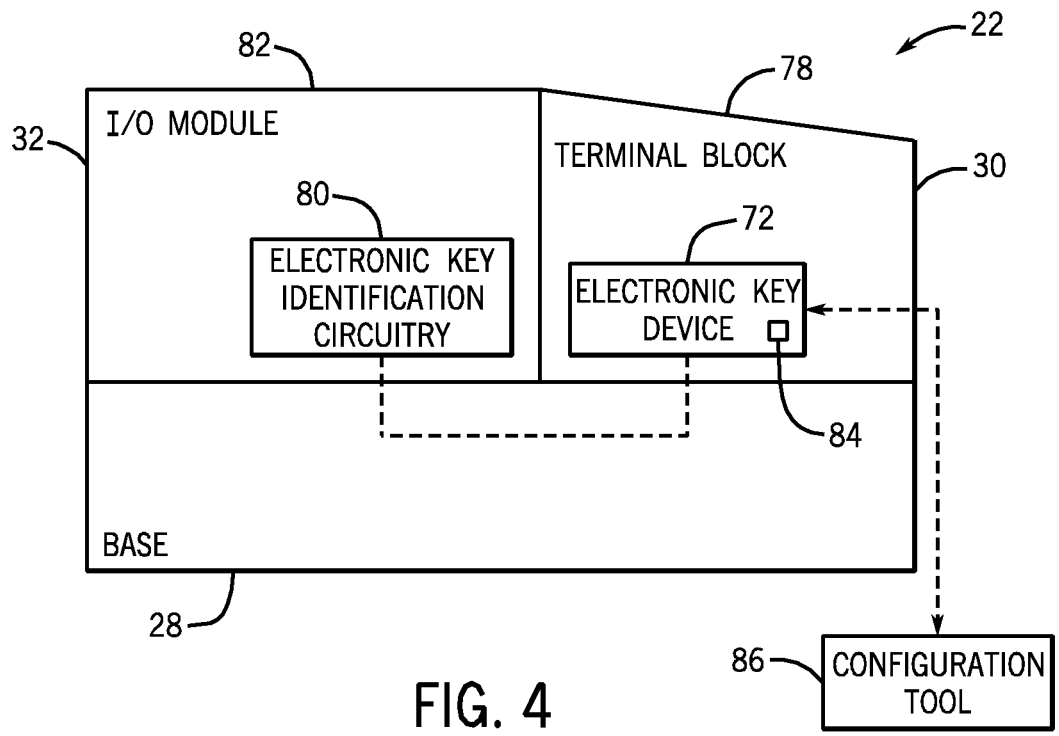
FIG. 4 is a schematic diagram of an exemplary I/O device that utilizes an electronic key device in a terminal block of the I/O device in accordance with embodiments of the present techniques.

In addition to or as an alternative to the mechanical keying features 68 described above, present embodiments include electronic keying features that may be used for preventing inadvertent coordination of terminal blocks 30 and/or I/O modules 32 with bases 28 which are not intended to be associated together. For example, as illustrated in FIG. 3, an electronic key feature 72 may be disposed within the terminal block 30. In certain embodiments, the electronic key feature 72 may be inserted into and ejected from a slot 74 in the terminal block 30, as illustrated by arrows 76. As opposed to the mechanical keying features 68 described above, the electronic keying feature 72 may include a seemingly infinite number of electronic key combinations, thereby preventing nearly all possible inadvertent insertions of terminal blocks 30 and/or I/O modules 32 into bases 28 to which they are not associated. FIG. 4 is a schematic diagram of an exemplary I/O device 22 that utilizes an electronic key device 72 disposed in a housing 78 of the terminal block 30 of the I/O device 22 in accordance with embodiments of the present techniques. In addition, the I/O module 32 includes electronic key identification circuitry 80 disposed in a housing 82 of the I/O module 32, which is configured to read or detect information from the electronic key device 72 in the terminal block 30 to determine whether the terminal block 30 is associated with the I/O module 32.

In certain embodiments, one or both of the electronic key device 72 and the electronic key identification circuitry 80 may be removable from their respective terminal block 30 and I/O module 32. Indeed, all of the electronic key devices and electronic key identification circuitry described herein may be removable from the component (e.g., terminal block 30, I/O module 32, or base 28) within which they are disposed. For example, one or both of the electronic key device 72 and the electronic key identification circuitry 80 may be inserted into and/or ejected from their respective terminal block 30 and I/O module 32, as illustrated in FIG. 3. As such, depending on the specific needs of the I/O device 22, the electronic key device 72 and/or the electronic key identification circuitry 80 may be replaced as needed to, for example, reconfigure the electronic keying features provided by the electronic key device 72 and electronic key identification circuitry 80.

Returning now to FIG. 4, in certain embodiments, the electronic key identification circuitry 80 of the I/O module 32 may read or detect a unique identifying characteristic, such as a terminal block identification key 84, that is stored within the electronic key device 72 of the terminal block 30. As discussed herein, the terminal block identification key 84 is an identification key (i.e., value, setting, or code) that is essentially uniquely assigned or generated and stored in the electronic key device 72 to facilitate identification of the terminal block 30 in the illustrated embodiment. In other embodiments, an identification key may be stored in other components of an I/O device 22 such that the electronic key identification circuitry 80 of a separate component can confirm correspondence between the two components.

As described in greater detail below, once the terminal block 30 and the I/O module 32 are inserted into the base 28, the electronic key identification circuitry 80 reads or detects the terminal block identification key 84 from the electronic key device 72 and determines whether the terminal block 30 and the I/O module 32 are associated with each other. More specifically, the electronic key identification circuitry 80 of the I/O module 32 is configured to check whether the terminal block identification key 84 of the electronic key device 72 of the terminal block 30 is equivalent to the terminal block identification key 84 that was expected by the electronic key identification circuitry 80. In some embodiments, upon initial coupling and detection, a component of the electronic key identification circuitry 80 may automatically associate itself with an existing terminal block identification key 84 in the electronic key device 72 such that all subsequent couplings of the corresponding components will require detection of the terminal block identification key 84 to enable cooperation between components.

As such, the terminal block 30 and the I/O module 32 of any given I/O device 22 may be paired together whereby the electronic key identification circuitry 80 of the I/O module 32 reads or detects the terminal block identification key 84 of the electronic key device 72 of the terminal block 30 as a uniquely identifying characteristic of the terminal block 30, and retains (e.g., stores) information relating to the terminal block identification key 84 for later verification that the terminal block 30 and the I/O module 32 are associated with each other. When the I/O module 32 and/or the terminal block 30 (if a removable terminal block 30) are removed from the base 28 of the I/O device 22, and then re-connected to the base 28 of the I/O device 22, the electronic key identification circuitry 80 of the I/O module 32 may re-verify that the same terminal block identification key 84 is present in the electronic key device 72 of the terminal block 30 to which the I/O module 32 is connected (e.g., via the base 28). When re-connected, if the terminal block identification key 84 of the electronic key device 72 of the terminal block 30 to which the I/O module 32 is connected is different than what is expected by the electronic key identification circuitry 80 of the I/O module 32, the mismatch may be reported. For example, in certain embodiments, an alert may be provided to the control/monitoring device 14 of FIG. 1, such that the mismatch may be acted upon (e.g., by an operator).

In addition, operation of the I/O device 22 may either be suspended or allowed to continue, depending on configuration settings of the particular I/O device 22. For example, if incorrect operation of the particular I/O device 22 due to a mismatch in the coupling of its associated I/O module 32 and terminal block 30 would lead to particularly severe consequences, the I/O device 22 may be configured to not operate at all (or operate with only limited functionality) in the event of a mismatched terminal block 30 and I/O module 32 combination. In other words, in the event of a mismatched terminal block 30 and I/O module 32 combination, the I/O device 22 may be completely disabled such that normal operation of the I/O device 22 is prevented, or only certain functions of the I/O device 22 may be disabled, such that the I/O device 22 may still operate, but with a reduced functionality set. Conversely, if incorrect operation of the particular I/O device 22 due to a mismatch in the coupling of its associated I/O module 32 and terminal block 30 would lead to minimal control issues, the I/O device 22 may be configured to continue operating in the event of a mismatched terminal block 30 and I/O module 32 combination. It should be noted that, in some embodiments, components of an I/O device 22 may include displays for indicating a value or setting associated with the electronic key device. This may facilitate proper user selection of components that are configured to cooperate.

The terminal block identification key 84 may be generated in various ways. For example, in certain embodiments, during configuration of the I/O device 22, an operator may manually set the terminal block identification key 84 to a particular value or setting using a configuration tool 86. In other words, the electronic key device 72 (and, indeed, all of the electronic key devices described herein) may be configured to facilitate manual assignment of the value or setting of the terminal block identification key 84 assigned to the electronic key device 72. However, in other embodiments, when the terminal block 30 and the I/O module 32 are first connected to each other via the base 28, the value or setting that the terminal block identification key 84 is assigned may be automatically generated. In other words, the electronic key feature 72 (and, indeed, all of the electronic key devices described herein) may include circuitry that automatically generates the value or setting of the terminal block identification key 84 assigned to the electronic key device 72 when the terminal block 30 and the I/O module 32 are physically and communicatively connected via the base 28 for the first time. In certain embodiments, an operator of the I/O device 22 may be prompted with an automatically generated value or setting for the terminal block identification key 84, and may be given an opportunity to accept or change the value or setting of the terminal block identification key 84. Furthermore, even after the terminal block identification key 84 has been set to a particular value for the combination of the terminal block 30 and the I/O module 32, the terminal block identification key 84 may be reset and/or reconfigured. In other words, the electronic key device 72 (and, indeed, all of the electronic key devices described herein) may be configured to facilitate resetting or reconfiguration of the value or setting of the terminal block identification key 84 assigned to the electronic key device 72. For example, an operator may change the value or setting of the terminal block identification key 84 at any time during maintenance of the I/O device 22 using the configuration tool 86.

Figure 5:
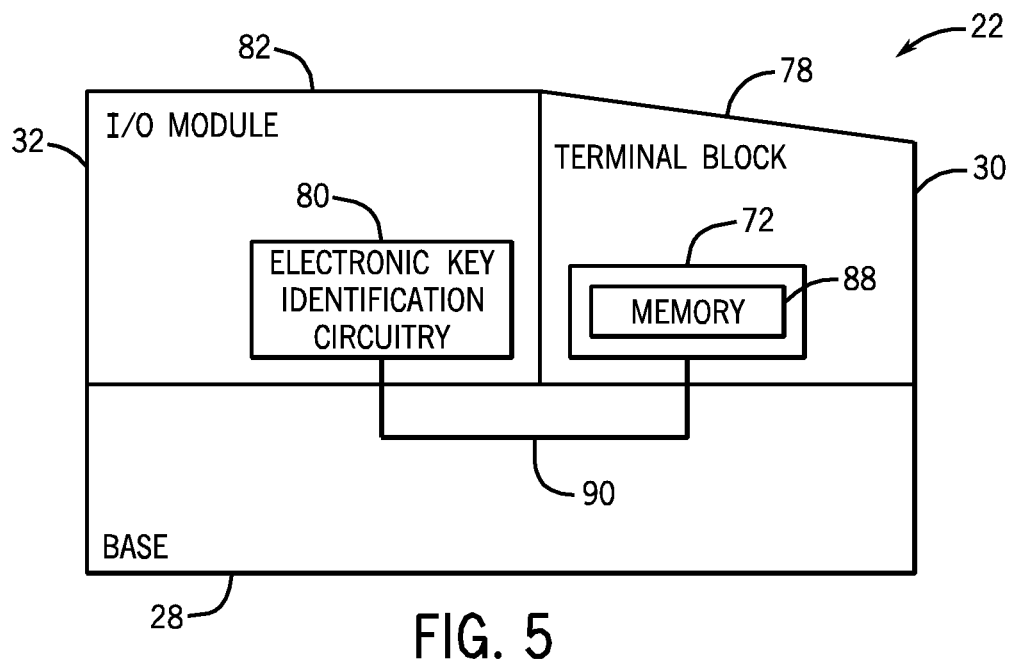
FIG. 5 is a schematic diagram of an exemplary I/O device that utilizes electronic keying features by storing a terminal block identification key in a memory of the electronic key device of the terminal block in accordance with embodiments of the present techniques.

The electronic keying features illustrated in FIG. 4 may be accomplished using any number of suitable techniques. In certain embodiments, the electronic key device 72 may include a memory for storing the terminal block identification key 84. For example, FIG. 5 is a schematic diagram of an exemplary I/O device 22 that utilizes electronic keying features by storing the terminal block identification key 84 in a memory 88 of the electronic key device 72 of the terminal block 30 in accordance with embodiments of the present techniques. In the illustrated embodiment, the electronic key identification circuitry 80 of the I/O module 32 reads the terminal block identification key 84 by communicating with the memory 88 of the electronic key device 72 via connections 90 through the base 28 of the I/O device 22. In other words, the electronic key identification circuitry 80 may directly read a value of the terminal block identification key 84 from the memory 88 of the electronic key device 72 when the I/O module 32 and/or the terminal block 30 are inserted into the base 28. Furthermore, the terminal block identification key 84 will determine whether the value is equal to an expected value to determine whether the I/O module 32 and the terminal block 30 are associated with each other.

Figure 6:
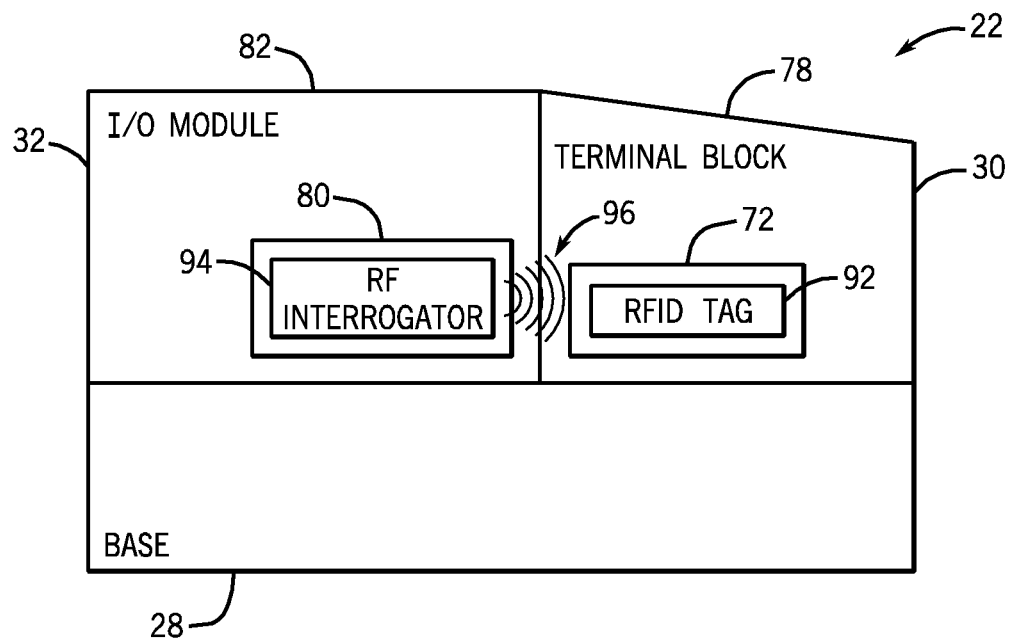
FIG. 6 is a schematic diagram of an exemplary I/O device that utilizes electronic keying features by storing the terminal block identification key in an RFID tag of the electronic key device of the terminal block in accordance with embodiments of the present techniques.

However, in other embodiments, the terminal block identification key 84 may be encoded on a radio frequency identification (RFID) tag on the electronic key device 72. For example, FIG. 6 is a schematic diagram of an exemplary I/O device 22 that utilizes electronic keying features by storing the terminal block identification key 84 in an RFID tag 92 of the electronic key device 72 of the terminal block 30 in accordance with embodiments of the present techniques. In the illustrated embodiment, the electronic key identification circuitry 80 of the I/O module 32 includes a radio frequency (RF) interrogator 94 for emitting radio waves 96, and receiving response radio waves to determine what the terminal block identification key 84 is for the electronic key device 72. In other words, the radio frequency (RF) interrogator 94 may interpret the response radio waves to ascertain a value of the terminal block identification key 84 from the RFID tag 92 of the electronic key device 72 when the I/O module 32 and/or the terminal block 30 are inserted into the base 28. Furthermore, the terminal block identification key 84 will determine whether the value is equal to an expected value to determine whether the I/O module 32 and the terminal block 30 are associated with each other.

Figure 7:
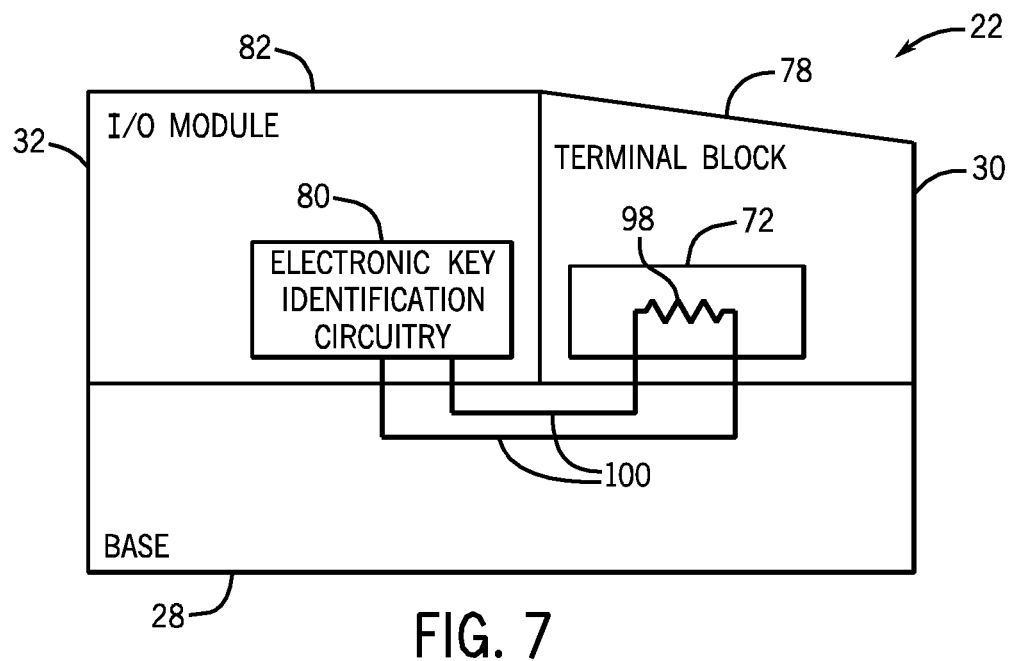
FIG. 7 is a schematic diagram of an exemplary I/O device that utilizes electronic keying features by conveying the terminal block identification key via a variable resistor in the electronic key device of the terminal block in accordance with embodiments of the present techniques.

Furthermore, in other embodiments, the electronic key device 72 may include a variable resistor configured to convey the terminal block identification key 84 to the electronic key identification circuitry 80 via connecting circuits through the base 28 of the I/O device 22. For example, FIG. 7 is a schematic diagram of an exemplary I/O device 22 that utilizes electronic keying features by conveying the terminal block identification key 84 via a variable resistor 98 in the electronic key device 72 of the terminal block 30 in accordance with embodiments of the present techniques. In the illustrated embodiment, the electronic key identification circuitry 80 may be connected to the variable resistor 98 via electrical wires 100 through the base 28 of the I/O device 22. As such, when a voltage is applied to the electrical wires 100, depending on the variable resistor 98, a known current should flow through the electrical wires 100. As such, the terminal block identification key 84 in this embodiment is not actually a value, but rather an expected resistance setting of the variable resistor 98 of the electronic key device 72 of the terminal block 30. When the I/O module 32 and/or the terminal block 30 are inserted into the base 28, the electronic key identification circuitry 80 may apply the voltage across the variable resistor 98, and measure the resulting current. Then, the terminal block identification key 84 compares the measured current to an expected current to determine whether the I/O module 32 and the terminal block 30 are associated with each other. Different types of variable resistors 98 may be acquired to designate particular components of an I/O device 22 in accordance with present embodiments.

Moreover, other techniques of conveying the terminal block identification key 84 of the electronic key device 72 to the electronic key identification circuitry 80 may be used, such as infrared (IrDA) communication techniques, DS2411 silicon serial number techniques, 1 to 3 wire techniques, magnetic communication techniques, PIC (peripheral interface controller) techniques, and so forth.

Figure 8:
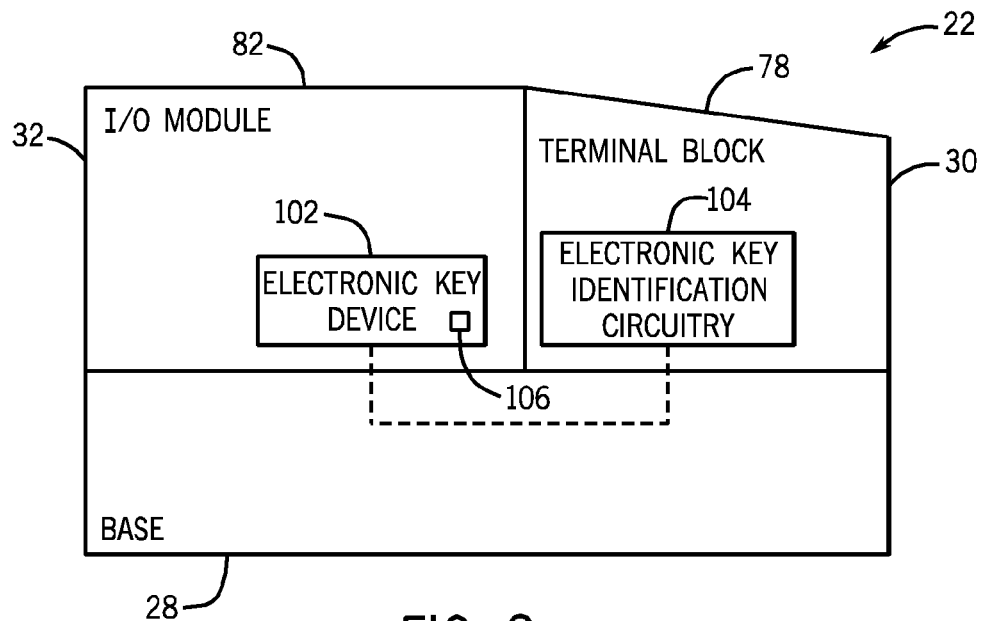
FIG. 8 is a schematic diagram of an exemplary I/O device that utilizes an electronic key device in an I/O module of the I/O device in accordance with embodiments of the present techniques.

The embodiments illustrated in FIGS. 4-7 all depict the use of the electronic key device 72 within the terminal block 30 of the I/O device 22, and the electronic key identification circuitry 80 within the I/O module 32 of the I/O device 22, whereby the electronic key identification circuitry 80 within the I/O module 32 reads or detects the terminal block identification key 84 from the electronic key device 72 within the terminal block 30 to determine whether the terminal block 30 and the I/O module 32 are associated with each other. However, in other embodiments, the electronic key device may instead be located within the I/O module 32, and the electronic key identification circuitry 80 may instead be located within the terminal block 30, such that the electronic key identification circuitry within the terminal block 30 reads or detects an I/O module identification key from the electronic key device within the I/O module 32 to determine whether the terminal block 30 and the I/O module 32 are associated with each other. For example, FIG. 8 is a schematic diagram of an exemplary I/O device 22 that utilizes an electronic key device 102 disposed in the housing 82 of the I/O module 32 of the I/O device 22 in accordance with embodiments of the present techniques. In addition, the terminal block 30 includes electronic key identification circuitry 104 disposed in the housing 78 of the terminal block 30, which is configured to read or detect information from the electronic key device 102 in the I/O module 32 to determine whether the terminal block 30 is associated with the I/O module 32.

More specifically, similar to the embodiments illustrated in FIGS. 4-7, the electronic key identification circuitry 104 of the terminal block 30 may read or detect a unique identifying characteristic, such as an I/O module identification key 106 that is stored within the electronic key device 102 of the I/O module 32. Once the terminal block 30 and the I/O module 32 are inserted into the base 28, the electronic key identification circuitry 104 reads or detects the I/O module identification key 106 from the electronic key device 102 and determines whether the terminal block 30 and the I/O module 32 are associated with each other. In other words, the electronic key identification circuitry 104 of the terminal block 30 is configured to check whether the I/O module identification key 106 of the electronic key device 102 of the I/O module 32 is equivalent to the I/O module identification key 106 that was expected by the electronic key identification circuitry 104. As such, similar to the embodiments illustrated in FIGS. 4-7, the terminal block 30 and the I/O module 32 of any given I/O device 22 may be paired together whereby the electronic key identification circuitry 104 of the terminal block 30 reads or detects the I/O module identification key 106 of the electronic key device 102 of the I/O module 32 as a uniquely identifying characteristic of the I/O module 32 and retains (e.g., stores) information relating to the I/O module identification key 106 for later verification that the terminal block 30 and the I/O module 32 are associated with each other.

The electronic key device 102 of the I/O module 32 and the electronic key identification circuitry 104 of the terminal block 30 illustrated in FIG. 8 function substantially similarly to the electronic key device 72 of the terminal block 30 and the electronic key identification circuitry 80 of the I/O module 32, respectively, of the embodiments illustrated in FIGS. 4-7. Indeed, all of the particular communication technologies illustrated in FIGS. 4-7 may be used in the embodiment illustrated in FIG. 8. For example, in certain embodiments, the I/O module identification key 106 may be stored within a memory of the I/O module 32, which may be read by the electronic key identification circuitry 104 of the terminal block 30. In addition, in certain embodiments, the I/O module identification key 106 may be encoded on an RFID tag that is read using radio waves from an RF interrogator in the electronic key identification circuitry 104 of the terminal block 30. Furthermore, in certain embodiments, the I/O module identification key 106 may be conveyed using a variable resistor in the electronic key device 102 of the I/O module 32. Moreover, other techniques of conveying the I/O module identification key 106 of the electronic key device 102 to the electronic key identification circuitry 104 may be used, such as infrared (IrDA) communication techniques, DS2411 silicon serial number techniques, 1 to 3 wire techniques, magnetic communication techniques, PIC (peripheral interface controller) techniques, and so forth.

Indeed, the electronic keying features described herein may be applied between any two or more electronic components (e.g., terminal block 30 to I/O module 32, terminal block 30 to base 28, I/O module 32 to base 28, and so forth). Indeed, in certain embodiments, more than two electronic components may utilize the electronic keying features described herein. For example, FIG. 9 is a schematic diagram of an exemplary I/O device 22 that utilizes electronic key devices 108, 110 disposed in the housings 78, 82 of both the terminal block 30 and the I/O module 32 of the I/O device 22 in accordance with embodiments of the present techniques. In addition, as illustrated, the base 28 of the I/O device 22 includes electronic key identification circuitry 112 disposed in a housing 114 of the base 28, which is configured to read or detect information from the electronic key devices 108, 110 in both the terminal block 30 and the I/O module 32 to determine whether the terminal block 30 is associated with the I/O module 32.

More specifically, similar to the embodiments illustrated in FIGS. 4-8, the electronic key identification circuitry 112 of the base 28 may read or detect unique identifying characteristics, such as a terminal block identification key 116 that is stored within the electronic key device 108 of the terminal block 30 and an I/O module identification key 118 that is stored within the electronic key device 110 of the I/O module 32. Once the terminal block 30 and the I/O module 32 are inserted into the base 28, the electronic key identification circuitry 112 reads or detects the terminal block identification key 116 and the I/O module identification key 118 from the electronic key devices 108, 110, respectively, and determines whether the terminal block 30 and the I/O module 32 are associated with each other. In other words, the electronic key identification circuitry 112 of the terminal block 30 is configured to check whether the terminal block identification key 116 and the I/O module identification key 118 of the electronic key devices 108, 110, respectively, are equivalent to the terminal block identification key 116 and the I/O module identification key 118 that were expected by the electronic key identification circuitry 112 (and/or whether the terminal block identification key 116 and the I/O module identification key 118 are equivalent). As such, similar to the embodiments illustrated in FIGS. 4-8, the terminal block 30 and the I/O module 32 of any given I/O device 22 may be paired together whereby the electronic key identification circuitry 112 of the base 28 reads or detects the terminal block identification key 116 and the I/O module identification key 118 of the electronic key devices 108, 110 of the terminal block 30 and the I/O module 32, respectively, and retains (e.g., stores) information relating to the terminal block identification key 116 and the I/O module identification key 118 for later verification that the terminal block 30 and the I/O module 32 are associated with each other.

Again, the electronic key devices 108, 110 of the terminal block 30 and the I/O module 32 and the electronic key identification circuitry 112 of the base 28 illustrated in FIG. 9 function substantially similarly to the electronic key devices 72, 102 and the electronic key identification circuitry 80, 104 of the embodiments illustrated in FIGS. 4-8. Indeed, again, all of the particular communication technologies illustrated in FIGS. 4-7 may be used in the embodiment illustrated in FIG. 9. For example, in certain embodiments, the terminal block identification key 116 and the I/O module identification key 118 may be stored within memories of the terminal block 30 and the I/O module 32, respectively, which may be read by the electronic key identification circuitry 112 of the base 28. In addition, in certain embodiments, the terminal block identification key 116 and the I/O module identification key 118 may be encoded on RFID tags that are read using radio waves from an RF interrogator in the electronic key identification circuitry 112 of the base 28. Furthermore, in certain embodiments, the terminal block identification key 116 and the I/O module identification key 118 may be conveyed using a variable resistor in the electronic key devices 108, 110 of the terminal block 30 and the I/O module 32, respectively. Moreover, other techniques of conveying the terminal block identification key 116 and the I/O module identification key 118 of the electronic key devices 108, 110 to the electronic key identification circuitry 112 may be used, such as infrared (IrDA) communication techniques, DS2411 silicon serial number techniques, 1 to 3 wire techniques, magnetic communication techniques, PIC (peripheral interface controller) techniques, and so forth.

In addition to being used to determine whether the terminal block 30 and the I/O module 32 are associated with each other, in certain embodiments, the electronic key devices 72, 102, 108, 110 may be used to transmit other information to and from the electronic key identification circuitry 80, 104, 112. An exemplary application is in terminal blocks 30 that utilize cold junction compensation (CJC), whereby thermocouples are located proximate to the terminals 34 of the terminal block 30 to ascertain temperature variations. In such an embodiment, sensors may be located in the terminal block 30, while the measurement is accomplished in the I/O module 32. As such, in certain embodiments, signals relating to the CJC measurements may be transmitted from the sensors via the electronic key device 72 in the terminal block 30 to the electronic key identification circuitry 80 in the I/O module 32. Using the electronic key devices 72, 102, 108, 110 and associated electronic key identification circuitry 80, 104, 112 for additional purposes, such as data transmission, minimizes the need for other connections between the components (e.g., the terminal blocks 30, the I/O modules 32, and the bases 28) of the I/O devices 22, thereby reducing the risk of disturbing such connections and maximizing the reliability of the I/O devices 22.

FIG. 10 is a process flow diagram 120 of a method of manufacturing an I/O device 22 having components that are linked via an electronic key device in accordance with the present techniques. In step 122, a first component (e.g., a base 28, a terminal block 30, an I/O module 32, and so forth) of the I/O device 22 is provided that includes an electronic key device (e.g., the electronic key devices 72, 102, 108, 110 as described herein). As described above, in certain embodiments, the electronic key device may include a memory 88 for storing a unique identification key (e.g., the identification keys 84, 106, 116, 118 as described herein) that may be used to identify the first component, an RFID tag 92 on which the unique identification key may be encoded, a variable resistor 98 for conveying the unique identification key via the variable resistance of the variable resistor 98, and so forth.

In step 124, a second component (e.g., a base 28, a terminal block 30, an I/O module 32, and so forth) of the I/O device 22 is provided that includes electronic key identification circuitry (e.g., the electronic key identification circuitry 80, 104, 112 as described herein). As described above, in certain embodiments, the electronic key identification circuitry may include circuitry for communicating with the memory 88 of the electronic key device of the first component to read the unique identification key of the first component, an RF interrogator 94 for detecting the unique identification key encoded on the RFID tag 92 of the electronic key device of the first component, circuitry for applying a voltage across the variable resistor 98 of the electronic key device of the first component to determine the unique identification key of the first component, and so forth.

In step 126, the first and second components of the I/O device 22 are communicatively coupled together. For example, in certain embodiments, an I/O module 32 (i.e., the first component) of the I/O device 22 may be physically and communicatively coupled to a terminal block 30 (i.e., the second component) of the I/O device 22 via a base 28 of the I/O device 22. In other embodiments, an I/O module 32 (i.e., the first component) of the I/O device 22 may be physically and communicatively coupled to an integrated terminal block 30 and base 28 combination (i.e., the second component) of the I/O device 22. In other embodiments, an I/O module 32 (i.e., the first component) of the I/O device 22 may be physically and communicatively coupled directly to a terminal block 30 (i.e., the second component) of the I/O device 22. As described above, in certain embodiments, the first time the first and second components of the I/O device 22 are physically and communicatively coupled together, the unique identification key may be automatically generated or manually configured by an operator of the I/O device 22. Also as described above, when the first and second components of the I/O device 22 are physically and communicatively coupled together subsequent times, the electronic key identification circuitry of the second component may read or detect the unique identification key from the electronic key device of the first component to determine whether the first and second components of the I/O device 22 are intended to operate together.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A system, comprising:
a terminal block having at least one terminal in a housing of the terminal block for connecting the terminal block to a field device configured to monitor or control an industrial automation process; and
an electronic key feature disposed within the housing of the terminal block, wherein the electronic key feature comprises a unique identification key, and wherein the electronic key feature is configured to be read or detected by electronic key identification circuitry of an input/output (I/O) module when the terminal block and the I/O module are physically and communicatively connected, wherein the I/O module is configured to communicate with the field device via the terminal block.

2. The system of claim 1, wherein the electronic key feature comprises a memory for storing the unique identification key.

3. The system of claim 2, wherein the electronic key identification circuitry is configured to read the unique identification key from the memory of the electronic key feature.

4. The system of claim 1, wherein the electronic key feature comprises a radio frequency identification (RFID) tag for storing the unique identification key.

5. The system of claim 4, wherein the electronic key identification circuitry comprises a radio frequency (RF) interrogator for emitting radio waves and receiving response radio waves from the RFID tag.

6. The system of claim 1, wherein the electronic key feature comprises a variable resistor having a resistance that corresponds to the unique identification key.

7. The system of claim 6, wherein the electronic key identification circuitry comprises circuitry for applying a voltage across the variable resistor of the electronic key feature.

8. The system of claim 1, wherein the electronic key feature is removable from within the housing of the terminal block.

9. The system of claim 1, wherein the electronic key feature is configured to facilitate manual assignment of the unique identification key assigned to the electronic key feature.

10. The system of claim 1, wherein the electronic key feature comprises circuitry that automatically generates the unique identification key when the terminal block and the I/O module are physically and communicatively connected for the first time.

11. The system of claim 1, wherein the electronic key feature is configured to facilitate reconfiguration of the unique identification key.

12. The system of claim 1, wherein the terminal block is integrated with an I/O device base portion.

13. A system, comprising:
an input/output (I/O) module having I/O communication circuitry disposed within a housing of the I/O module configured to communicate, via a terminal block, with one or more field devices configured to monitor and/or control an industrial automation process; and
electronic key identification circuitry disposed within the housing of the I/O module, wherein the electronic key identification circuitry is configured to read or detect a unique identification key of an electronic key feature disposed within [[a]] the terminal block when the I/O module and the terminal block are physically and communicatively connected.

14. The system of claim 13, wherein the electronic key identification circuitry is configured to read the unique identification key from a memory of the electronic key feature.

15. The system of claim 13, wherein the electronic key identification circuitry comprises a radio frequency (RF) interrogator for emitting radio waves and receiving response radio waves from an RFID tag of the electronic key feature.

16. The system of claim 13, wherein the electronic key identification circuitry comprises circuitry for applying a voltage across a variable resistor of the electronic key feature.

17. The system of claim 13, wherein the electronic key identification circuitry is configured to disable the I/O module if the unique identification key read or detected from the electronic key feature is not equivalent to an expected value or setting.

18. The system of claim 13, wherein the electronic key identification circuitry is configured to provide an alert if the unique identification key read or detected from the electronic key feature is not equivalent to an expected value or setting.

19. An input/output (I/O) device, comprising:
an input/output (I/O) module comprising I/O communication circuitry;
a terminal block configured to be communicatively connected to the I/O module and having a plurality of terminals associated with one or more inputs and/or one or more outputs of a field device configured to monitor or control an industrial automation process;
an electronic key feature comprising a unique identification key; and electronic key identification circuitry configured to read or detect the unique identification key of the electronic key feature when the I/O module and the terminal block are communicatively connected to each other.

20. The I/O device of claim 19, wherein the electronic key feature is disposed within a housing of the terminal block, and the electronic key identification circuitry is disposed within a housing of the I/O module.

21. The I/O device of claim 19, wherein the electronic key feature is disposed within a housing of the I/O module, and the electronic key identification circuitry is disposed within a housing of the terminal block.

22. The I/O device of claim 19, wherein the I/O module and the terminal block are communicatively connected to each other via a base portion of the I/O device.

23. The I/O device of claim 22, comprising first and second electronic key features comprising first and second respective unique identification keys, wherein the first electronic key feature is disposed within a housing of the I/O module and the second electronic key feature is disposed within a housing of the terminal block, and wherein the electronic key identification circuitry is disposed within a housing of the base portion.

24. The I/O device of claim 22, wherein the terminal block and the base portion are integral with each other.

* * * * *